(12) United States Patent
Lu

(10) Patent No.: US 8,169,781 B2
(45) Date of Patent: May 1, 2012

(54) POWER SUPPLY AND HEAT DISSIPATION MODULE THEREOF

(75) Inventor: Shao-Feng Lu, Taoyuan County (TW)

(73) Assignees: FSP Technology Inc., Taoyuan, Taoyuan County (TW); 3Y Power Technology (Taiwan), Inc., Guishan Township, Taoyuan County (TW)

( * ) Notice: Subject to any disclaimer, the term of this patent is extended or adjusted under 35 U.S.C. 154(b) by 0 days.

(21) Appl. No.: 12/754,621

(22) Filed: Apr. 6, 2010

(65) Prior Publication Data

US 2011/0242766 A1   Oct. 6, 2011

(51) Int. Cl.
- H05K 7/20 (2006.01)
- H05K 5/00 (2006.01)
- F28F 7/00 (2006.01)

(52) U.S. Cl. ... 361/711; 361/709; 361/704; 361/679.54; 361/718; 361/719; 165/80.2; 165/185; 454/184

(58) Field of Classification Search ............ 361/711, 361/704, 709, 718, 719, 679.54; 165/80.2, 165/80.3, 185; 454/184

See application file for complete search history.

(56) References Cited

U.S. PATENT DOCUMENTS

| | | | | |
|---|---|---|---|---|
| 4,639,834 A * | 1/1987 | Mayer | | 361/710 |
| 4,707,726 A * | 11/1987 | Tinder | | 174/252 |
| 4,872,102 A * | 10/1989 | Getter | | 363/141 |
| 5,155,660 A * | 10/1992 | Yamada et al. | | 361/717 |
| 5,170,336 A * | 12/1992 | Getter et al. | | 363/141 |
| 5,235,491 A * | 8/1993 | Weiss | | 361/694 |
| 5,297,025 A * | 3/1994 | Shoquist et al. | | 361/704 |
| 5,321,582 A * | 6/1994 | Casperson | | 361/713 |
| 5,424,915 A * | 6/1995 | Katooka et al. | | 361/695 |
| 5,502,618 A * | 3/1996 | Chiou | | 361/695 |
| 5,521,792 A * | 5/1996 | Pleitz et al. | | 361/715 |
| 5,742,478 A * | 4/1998 | Wu | | 361/704 |
| 5,754,401 A * | 5/1998 | Saneinejad et al. | | 361/705 |
| 5,801,330 A * | 9/1998 | Gademann et al. | | 174/559 |
| 5,815,371 A * | 9/1998 | Jeffries et al. | | 361/704 |
| 5,831,847 A * | 11/1998 | Love | | 363/141 |
| 5,909,358 A * | 6/1999 | Bradt | | 361/707 |
| 5,910,884 A * | 6/1999 | Garza et al. | | 361/690 |
| 5,926,373 A * | 7/1999 | Stevens | | 361/704 |
| 5,936,839 A * | 8/1999 | Saito | | 361/707 |
| 5,943,220 A * | 8/1999 | Shikata et al. | | 361/818 |
| 5,991,151 A * | 11/1999 | Capriz | | 361/704 |
| 6,025,991 A * | 2/2000 | Saito | | 361/704 |
| 6,044,899 A * | 4/2000 | Langley et al. | | 165/104.33 |
| 6,046,908 A * | 4/2000 | Feng | | 361/707 |
| 6,049,469 A * | 4/2000 | Hood | | 361/818 |
| 6,191,360 B1 * | 2/2001 | Tao et al. | | 174/522 |
| 6,195,257 B1 * | 2/2001 | Janicek et al. | | 361/704 |
| 6,225,559 B1 * | 5/2001 | Hubner et al. | | 174/542 |
| 6,320,776 B1 * | 11/2001 | Kajiura et al. | | 363/141 |
| 6,337,796 B2 * | 1/2002 | Yamada et al. | | 361/719 |
| 6,411,514 B1 * | 6/2002 | Hussaini | | 361/704 |
| 6,434,006 B1 * | 8/2002 | Fukatsu et al. | | 361/704 |

(Continued)

Primary Examiner — Bradley Thomas
(74) Attorney, Agent, or Firm — Winston Hsu; Scott Margo

(57) ABSTRACT

A power supply includes a casing, a printed circuit board (PCB) and a heat dissipation module. The PCB is disposed in the casing and has a heat-generating element. The casing has a top cover. The heat dissipation module includes a heatsink and a heat dissipation plate. The heatsink is disposed at the PCB and contacts the heat-generating elements. The heatsink has a surface facing the top cover. The heat dissipation plate is disposed between the heatsink and the top cover and contacts the surface of the heatsink.

7 Claims, 1 Drawing Sheet

U.S. PATENT DOCUMENTS

| | | | |
|---|---|---|---|
| 6,469,895 B1* | 10/2002 | Smith et al. | 361/704 |
| 6,515,858 B2* | 2/2003 | Rodriguez et al. | 361/695 |
| 6,542,368 B2* | 4/2003 | Miyazawa | 361/704 |
| 6,570,086 B1* | 5/2003 | Shimoji et al. | 174/377 |
| 6,583,988 B1* | 6/2003 | Lyons et al. | 361/719 |
| 6,590,783 B2* | 7/2003 | Spratte et al. | 361/800 |
| 6,621,700 B1* | 9/2003 | Roman et al. | 361/697 |
| 6,631,078 B2* | 10/2003 | Alcoe et al. | 361/719 |
| 6,665,183 B1* | 12/2003 | Shikata et al. | 361/697 |
| 6,680,849 B2* | 1/2004 | Atkinson et al. | 361/719 |
| 6,728,104 B1* | 4/2004 | Ahmad et al. | 361/704 |
| 6,735,078 B2* | 5/2004 | Tsai | 361/695 |
| 6,798,661 B1* | 9/2004 | Barsun et al. | 361/700 |
| 6,903,936 B2* | 6/2005 | Lin | 361/752 |
| 6,972,959 B2* | 12/2005 | Asai et al. | 361/719 |
| 6,977,815 B2* | 12/2005 | Hsu | 361/704 |
| 7,068,510 B2* | 6/2006 | Crippen et al. | 361/702 |
| 7,082,034 B2* | 7/2006 | Tiwari et al. | 361/719 |
| 7,085,136 B2* | 8/2006 | Lin | 361/712 |
| 7,133,284 B2* | 11/2006 | Lee | 361/697 |
| 7,136,286 B2* | 11/2006 | Chuang | 361/703 |
| 7,145,775 B2* | 12/2006 | Barsun et al. | 361/719 |
| 7,170,014 B1* | 1/2007 | Liang | 174/383 |
| 7,265,981 B2* | 9/2007 | Lee | 361/707 |
| 7,304,835 B2* | 12/2007 | Ku et al. | 361/679.01 |
| 7,307,844 B2* | 12/2007 | Wu | 361/719 |
| 7,330,353 B2* | 2/2008 | Gilliland et al. | 361/703 |
| 7,349,214 B2* | 3/2008 | Jeong | 361/704 |
| 7,372,696 B2* | 5/2008 | Kauranen et al. | 361/692 |
| 7,436,661 B2* | 10/2008 | Fong et al. | 361/695 |
| 7,447,017 B2* | 11/2008 | Koo | 361/688 |
| 7,492,597 B2* | 2/2009 | Huang | 361/719 |
| 7,515,412 B2* | 4/2009 | Lee | 361/695 |
| 7,539,026 B2* | 5/2009 | Finnerty et al. | 361/803 |
| 7,660,114 B2* | 2/2010 | Watanabe et al. | 361/690 |
| 7,679,906 B2* | 3/2010 | Fong et al. | 361/695 |
| 7,679,935 B2* | 3/2010 | Horng | 361/818 |
| 7,724,526 B2* | 5/2010 | Hinze et al. | 361/704 |
| 7,733,647 B2* | 6/2010 | Lee | 361/690 |
| 7,738,253 B2* | 6/2010 | Araujo | 361/720 |
| 7,773,378 B2* | 8/2010 | Lin | 361/690 |
| 7,813,128 B2* | 10/2010 | Marchand | 361/694 |
| 7,817,425 B2* | 10/2010 | Jeong | 361/704 |
| 7,843,684 B2* | 11/2010 | Lu et al. | 361/679.47 |
| 7,855,891 B1* | 12/2010 | Ayres et al. | 361/711 |
| 2002/0006027 A1* | 1/2002 | Rodriguez et al. | 361/688 |
| 2003/0067749 A1* | 4/2003 | Tamba et al. | 361/699 |
| 2003/0210524 A1* | 11/2003 | Berg et al. | 361/687 |
| 2004/0252457 A1* | 12/2004 | Hsieh et al. | 361/695 |
| 2005/0030719 A1* | 2/2005 | Lin et al. | 361/719 |
| 2005/0259401 A1* | 11/2005 | Han et al. | 361/704 |
| 2006/0203453 A1* | 9/2006 | Chen | 361/704 |
| 2007/0025087 A1* | 2/2007 | Chen | 361/704 |
| 2007/0215329 A1* | 9/2007 | Schwab | 165/122 |
| 2008/0101041 A1* | 5/2008 | Chang et al. | 361/728 |
| 2010/0008047 A1* | 1/2010 | Moon et al. | 361/714 |

\* cited by examiner

US 8,169,781 B2

POWER SUPPLY AND HEAT DISSIPATION MODULE THEREOF

BACKGROUND OF THE INVENTION

1. Field of the Invention

The present invention generally relates to an electronic apparatus and a heat dissipation module thereof, and more particularly, to a power supply and a heat dissipation module thereof.

2. Description of Related Art

In the modern time where the electronic industry has fully developed, most of various electronic apparatuses employs a power supply for providing electric power. Generally, the major function of a power supply is to convert an alternating current (AC) into a stable direct current source (DC source) required by various electronic apparatuses.

The electronic components in a power supply would generate thermal energy during the operation. Therefore, a heatsink is employed and disposed in the power supply for dissipating heat to avoid the electronic components from getting excessively high temperature. The heatsink directly contacts the casing of the power supply so as to transfer the heat out of the casing. With such a disposition design however, the casing of the power supply would get a quite high temperature so that a user easily accidentally touches the casing to get scalded.

SUMMARY OF THE INVENTION

Accordingly, the present invention is directed to a power supply, which is able to reduce the excessively high temperature of the casing thereof.

The present invention is also directed to a heat dissipation module, which is able to reduce the excessively high temperature of the casing of a power supply.

The present invention provides a power supply, which includes a casing, a printed circuit board (PCB) and a heat dissipation module. The casing has a top cover. The PCB is disposed in the casing and has a heat-generating element. The heat dissipation module includes a heatsink and a heat dissipation plate. The heatsink is disposed at the PCB and contacts the heat-generating elements. The heatsink has a surface facing the top cover. The heat dissipation plate is disposed between the heatsink and the top cover and contacts the surface of the heatsink.

In an embodiment of the present invention, the above-mentioned heat-generating element is a diode.

The present invention provides a heat dissipation module suitable for a power supply. The power supply includes a casing and a PCB. The casing has a top cover. The PCB is disposed in the casing and has a heat-generating element. The heat dissipation module includes a heatsink and a heat dissipation plate. The heatsink is disposed at the PCB and contacts the heat-generating elements. The heatsink has a surface facing the top cover. The heat dissipation plate is disposed between the heatsink and the top cover and contacts the surface of the heatsink.

In an embodiment of the present invention, the power supply has a first interval between the above-mentioned heat dissipation plate and the PCB, the power supply further has a second interval between the top cover and the PCB and the second interval is greater than the first interval.

In an embodiment of the present invention, the above-mentioned heat dissipation module further includes a plurality of fixing pillars fixed between the heat dissipation plate and the casing.

In an embodiment of the present invention, the material of the above-mentioned fixing pillars is copper.

In an embodiment of the present invention, the above-mentioned heat dissipation module further includes a heat-conducting pad disposed on the surface of the heatsink and contacting the heat dissipation plate.

In an embodiment of the present invention, the above-mentioned heat dissipation plate has a plurality of through holes.

Based on the depiction above, the present invention disposes the heat dissipation plate on the heatsink and located between the top cover of the casing and the heatsink so that the heatsink transfers the thermal energy to the heat dissipation plate instead of transferring the thermal energy to the casing. In this way, the present invention can reduce the excessively high temperature of the casing and avoid a user from accidentally touching the top cover to get scalded.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
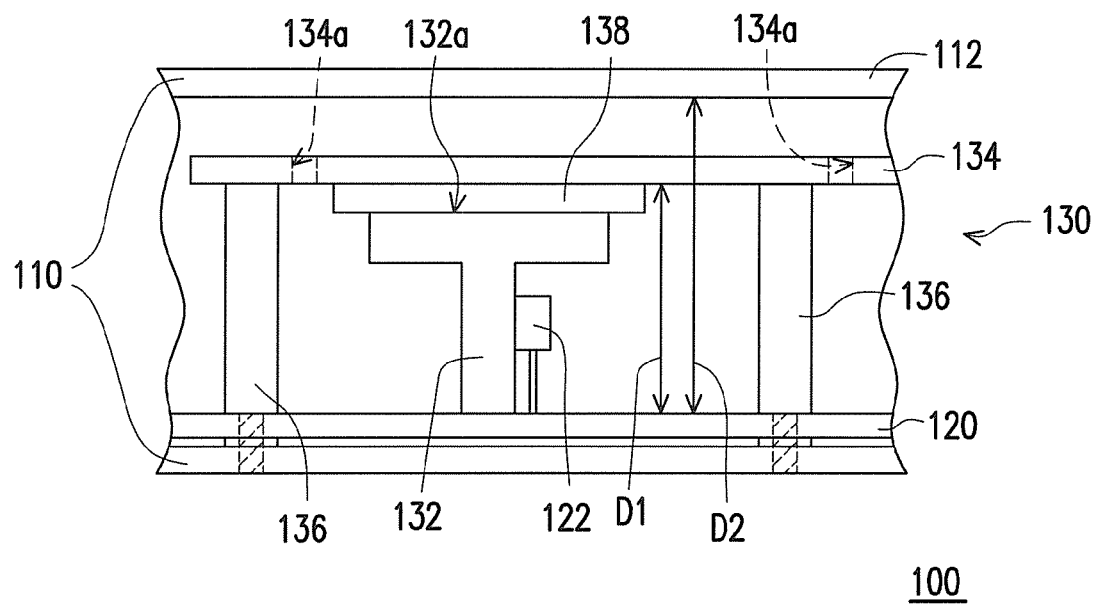
FIG. 1 is a localized top view diagram of a power supply according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a localized top view diagram of a power supply according to an embodiment of the present invention. Referring to FIG. 1, a power supply 100 in the embodiment is suitable for, for example, PC, server or other electronic apparatuses and the power supply 100 includes a casing 110, a PCB 120 and a heat dissipation module 130. The casing 110 has a top cover 112. The PCB 120 is disposed in the casing 110 and has a heat-generating element 122. The heat-generating element 122 in the embodiment is, for example, a diode which can be used in a synchronizing rectifier circuit where metal-oxide-semiconductor field-effect transistors (MOSFETs) are employed as switches thereof.

The heat dissipation module 130 is for conducting heat dissipation on the heat-generating element 122 of the PCB 120. The heat dissipation module 130 includes a heatsink 132 and a heat dissipation plate 134, wherein the heatsink 132 is disposed at the PCB 120 and contacts the heat-generating element 122, and the heatsink 132 has a surface 132a facing the top cover 112. The heat dissipation plate 134 is disposed between the heatsink 132 and the top cover 112 and contacts the surface 132a of the heatsink 132. The thermal energy generated by the heat-generating element 122 can be transferred to the heatsink 132 and the heat dissipation plate 134 so as to avoid an excessively high temperature of the heat-generating element 122 to downgrade the operation performance thereof.

In the embodiment, the thermal energy of the heatsink 132 is conducted to the heat dissipation plate 134 instead of being conducted to the casing 110. As a result, the temperature of the casing 110 is not excessively high, which is advantageous in avoiding a user from accidentally touching the top cover 112 of the casing 110 to get scalded. In more details, in the embodiment, there is a first interval D1 between the heat dissipation plate 134 and the PCB 120, there is a second interval D2 between the top cover 112 and the PCB 120, and the second interval D2 is greater than the first interval D1. In this way, neither the heat dissipation plate 134 nor the heatsink 132 would contact the top cover 112 of the casing 110, which is advantageous in avoiding the thermal energy of the heat dissipation plate 134 or the heatsink 132 is conducted to the top cover 112.

Figure 2:
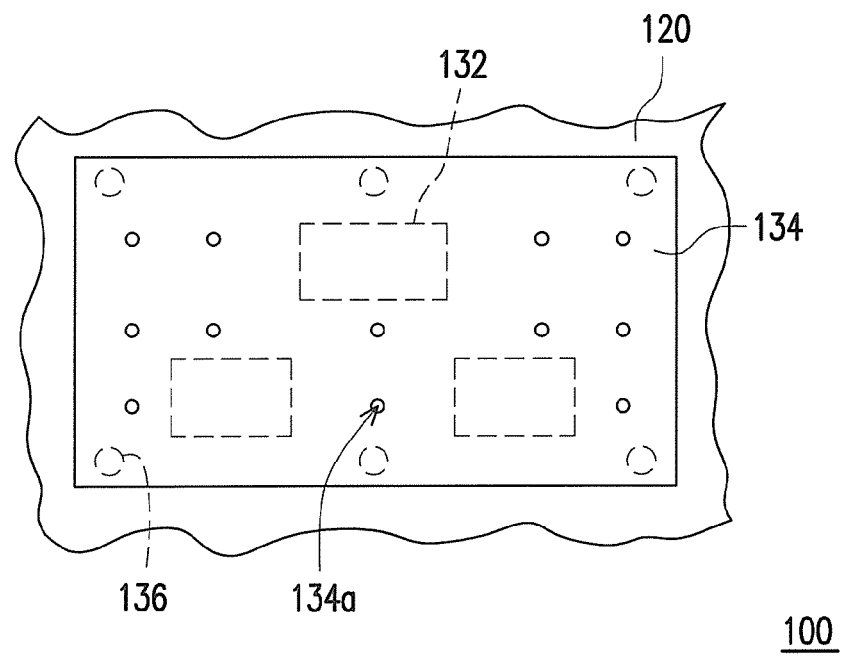
FIG. 2 is a localized top view diagram of the power supply of FIG. 1.

FIG. 2 is a localized top view diagram of the power supply of FIG. 1. For better showing, in FIG. 2, the casing 110 is omitted. Referring to FIG. 2, the present invention does not restrict the quantity of the employed heatsink 132, a practical quantity can be three as shown by FIG. 2 or other appropriate number. The heat dissipation plate 134 has a plurality of through holes 134a (shown in FIG. 1) and the through holes function to enhance the air convection inside the power supply 100 so as to further increase the heat dissipation efficiency.

In addition, referring to FIGS. 1 and 2, the heat dissipation module 130 of the embodiment further includes a plurality of fixing pillars 136 fixed between the heat dissipation plate 134 and the casing 110. As shown in FIG. 1, the fixing pillars 136 can tight the PCB 120 and the casing 110 together through thread elements, wherein the material of the fixing pillars 136 is, for example, copper or other appropriate materials, which the present invention is not limited to. Besides, the heat dissipation module 130 of the embodiment further includes a heat-conducting pad 138 disposed on the surface 132a of the heatsink 132 and contacting the heat dissipation plate 134. The heat-conducting pad 138 is made of heat-conducting but insulated material, for example, insulation silicon plastic so as to transfer the thermal energy of the heatsink 132 to the heat dissipation plate 134.

In summary, the present invention disposes the heat dissipation plate on the heatsink and located between the top cover of the casing and the heatsink so that the heatsink can transfer the thermal energy to the heat dissipation plate not to the casing. In this way, the present invention can reduce the excessively high temperature of the casing and avoid a user from accidentally touching the casing to get scalded. In addition, the heat dissipation plate has a plurality of through holes to enhance the air convection inside the power supply so as to further increase the heat dissipation efficiency.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. A power supply, comprising:
   a casing, having a top cover;
   a printed circuit board, disposed in the casing and having a heat-generating element;
   a heat dissipation module, disposed inside the casing, the heat dissipation module comprising:
      a heatsink, directly disposed at the printed circuit board and a standing part of the heatsink directly contacting the heat-generating element, wherein a top of the heatsink has a surface facing the top cover;
      a heat dissipation planar-plate, disposed between the surface of the top of the heatsink and the top cover;
      a heat-conducting planar-pad, directly disposed on the surface of the top of the heatsink and directly contacting the heat dissipation planar-plate, wherein the heat-conducting planar-pad is used for transferring thermal energy from the heatsink to the heat dissipation planar-plate; and
      a plurality of fixing pillars fixed between the heat dissipation planar-plate and the casing,
   wherein the heat dissipation planar-plate has a plurality of through holes, the through holes are used for enhancing air convection inside the power supply, so as to further increase heat dissipation efficiency,
   wherein there is a first interval between the heat dissipation planar-plate and the printed circuit board, there is a second interval between the top cover and the printed circuit board, and the second interval is greater than the first interval,
   wherein the heat conducting planar-pad is made of heat-conducting but insulated material.

2. The power supply as claimed in claim 1, wherein the material of the fixing pillars is copper.

3. The power supply as claimed in claim 1, wherein the heat-generating element is a diode.

4. The power supply as claimed in claim 1, wherein the heatsink is a T-shaped heatsink.

5. A heat dissipation module, suitable for a power supply comprising a casing and a printed circuit board, wherein the casing has a top cover, the printed circuit board is disposed in the casing and has a heat-generating element, and the heat dissipation module comprises:
   a heatsink, directly disposed at the printed circuit board and a standing part of the heatsink directly contacting the heat-generating element, wherein a top of the heatsink has a surface facing the top cover;
   a heat dissipation planar-plate, disposed between the surface of the top of the heatsink and the top cover;
   a heat-conducting planar-pad, directly disposed on the surface of the top of the heatsink and directly contacting the heat dissipation planar-plate, wherein the heat-conducting planar-pad is used for transferring thermal energy from the heatsink to the heat dissipation planar-plate; and
   a plurality of fixing pillars fixed between the heat dissipation planar-plate and the casing,
   wherein the heat dissipation module is disposed inside the casing, and
   wherein the heat dissipation planar-plate has a plurality of through holes, the through holes are used for enhancing air convection inside the power supply, so as to further increase heat dissipation efficiency,
   wherein there is a first interval between the heat dissipation planar-plate and the printed circuit board, there is a second interval between the top cover and the printed circuit board, and the second interval is greater than the first interval,
   wherein the heat conducting planar-pad is made of heat-conducting but insulated material.

6. The heat dissipation module as claimed in claim 5, wherein the material of the fixing pillars is copper.

7. The heat dissipation module as claimed in claim 5, wherein the heatsink is a T-shaped heatsink.

* * * * *